(12) United States Patent
Kondo (10) Patent No.: US 8,052,882 B2
(45) Date of Patent: Nov. 8, 2011

(54) METHOD OF MANUFACTURING WIRING SUBSTRATE

(75) Inventor: Hitoshi Kondo, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 288 days.

(21) Appl. No.: 12/425,668

(22) Filed: Apr. 17, 2009

(65) Prior Publication Data

US 2009/0283497 A1    Nov. 19, 2009

(30) Foreign Application Priority Data

May 15, 2008 (JP) .................................. 2008-128057

(51) Int. Cl.
*B44C 1/22* (2006.01)

(52) U.S. Cl. ............ 216/18; 216/39; 216/105; 438/700; 438/754

(58) Field of Classification Search .................. None
See application file for complete search history.

(56) References Cited

U.S. PATENT DOCUMENTS

| | | | |
|---|---|---|---|
| 5,800,722 A * | 9/1998 | Tsuyoshi et al. ................. 216/13 |
| 5,802,714 A * | 9/1998 | Kobayashi et al. ............... 29/852 |
| 6,780,751 B2 * | 8/2004 | Fay ................................. 438/613 |
| 7,246,435 B2 * | 7/2007 | Okamoto et al. ................ 29/852 |
| 7,420,130 B2 * | 9/2008 | Okamoto et al. ............... 174/262 |
| 7,696,613 B2 * | 4/2010 | Nakamura et al. .............. 257/668 |
| 2002/0131247 A1 * | 9/2002 | Cooray ............................ 361/750 |
| 2003/0124832 A1 * | 7/2003 | Tseng et al. ..................... 438/613 |
| 2004/0040148 A1 * | 3/2004 | DeMaso et al. ................. 29/852 |
| 2004/0072416 A1 * | 4/2004 | Fay ................................. 438/614 |
| 2004/0238209 A1 * | 12/2004 | Yuri et al. ....................... 174/257 |
| 2005/0279253 A1 * | 12/2005 | Nakamura et al. .......... 106/286.1 |
| 2006/0016553 A1 * | 1/2006 | Watanabe .................... 156/272.2 |
| 2006/0121719 A1 * | 6/2006 | Nakamura et al. .............. 438/613 |
| 2006/0163740 A1 * | 7/2006 | Ohno et al. ..................... 257/762 |
| 2006/0175084 A1 * | 8/2006 | Okamoto et al. ............... 174/262 |
| 2006/0292435 A1 * | 12/2006 | Liu et al. .......................... 429/44 |
| 2007/0057363 A1 * | 3/2007 | Nakamura et al. .............. 257/698 |
| 2007/0114203 A1 * | 5/2007 | Kang ............................... 216/13 |
| 2007/0126030 A1 * | 6/2007 | Ito .................................... 257/211 |
| 2007/0240901 A1 * | 10/2007 | Okamoto et al. ............... 174/262 |
| 2007/0257356 A1 * | 11/2007 | Abe et al. ....................... 257/700 |
| 2008/0142976 A1 * | 6/2008 | Kawano .......................... 257/758 |
| 2008/0189943 A1 * | 8/2008 | Hirose et al. ..................... 29/852 |
| 2008/0190657 A1 * | 8/2008 | Kanetaka et al. ............... 174/263 |

(Continued)

FOREIGN PATENT DOCUMENTS

JP    2-238942    9/1990

(Continued)

*Primary Examiner* — Allan Olsen
(74) *Attorney, Agent, or Firm* — Kratz, Quintos & Hanson, LLP (57) ABSTRACT

A method of manufacturing a wiring substrate of the present invention, includes the steps of forming a seed layer on an underlying layer, forming a plating resist in which an opening portion is provided on the seed layer, forming a copper plating layer in the opening portion by an electroplating, removing the plating resist, wet-etching the seed layer using the copper plating layer as a mask to obtain the wiring layer, roughening a surface of the wiring layer by a blackening process, and forming an insulating layer on the wiring layer, wherein a surface of the copper plating layer is soft-etched simultaneously in the step of etching the seed layer, whereby a soft etching step of the wiring layer carried out prior to the step of the blackening process is omitted.

10 Claims, 7 Drawing Sheets

(Example in which the present invention is applied to a stacked via structure)

U.S. PATENT DOCUMENTS

| | | | |
|---|---|---|---|
| 2008/0268209 A1* | 10/2008 | Woo et al. | 428/192 |
| 2008/0283282 A1* | 11/2008 | Kawasaki et al. | 174/258 |
| 2009/0095514 A1* | 4/2009 | Kaneko | 174/258 |
| 2009/0101510 A1* | 4/2009 | Kang | 205/125 |
| 2009/0188703 A1* | 7/2009 | Ito et al. | 174/255 |
| 2009/0238956 A1* | 9/2009 | Kojima | 427/98.5 |
| 2009/0269704 A1* | 10/2009 | Hodono | 430/319 |
| 2009/0283497 A1* | 11/2009 | Kondo | 216/13 |
| 2009/0288870 A1* | 11/2009 | Kondo et al. | 174/261 |
| 2009/0297096 A1* | 12/2009 | Hodono | 385/14 |
| 2010/0000771 A1* | 1/2010 | Shimauchi et al. | 174/257 |
| 2010/0044085 A1* | 2/2010 | Nakamura | 174/257 |
| 2010/0065322 A1* | 3/2010 | Ogawa et al. | 174/262 |
| 2010/0104246 A1* | 4/2010 | Hodono | 385/88 |
| 2010/0129036 A1* | 5/2010 | Hodono | 385/88 |
| 2010/0233476 A1* | 9/2010 | Uchida et al. | 428/344 |
| 2011/0036625 A1* | 2/2011 | Narahashi et al. | 174/261 |

FOREIGN PATENT DOCUMENTS

JP        2003-8199 A1        1/2003

* cited by examiner

FIG. 1A (Prior Art)

(before the surface roughening)

FIG. 1B (Prior Art)

(after the surface roughening)

Roughening process of the wiring layer in the related art

(Example in which the present invention is applied to a stacked via structure)

METHOD OF MANUFACTURING WIRING SUBSTRATE

CROSS-REFERENCE TO RELATED APPLICATIONS

This application is based on and claims priority of Japanese Patent Application No. 2008-128057 filed on May 15, 2008, the entire contents of which are incorporated herein by reference.

BACKGROUND OF THE INVENTION

1. Field of the Invention

The present invention relates to a method of manufacturing a wiring substrate and, more particularly, a method of manufacturing a wiring substrate, which is applicable to a substrate of a semiconductor package.

2. Description of the Related Art

In the prior art, there is the build-up wiring substrate equipped with a multilayer wiring in which wiring layers and resin layers are formed alternately on a substrate. In the method of manufacturing such build-up wiring substrate, first, a wiring layer made of copper is formed on the substrate. Then, unevenness is formed by etching a surface of the wiring layer by about 1 to 2 μm. Then, an interlayer insulating layer is formed by pasting a resin film on the wiring layer, or the like.

By forming unevenness (concave-convex) to a surface of the wiring layer to roughen, adhesion between the wiring layer and the overlying interlayer insulating layer can be secured. Also, the step of forming a via hole reaching the wiring layer in the interlayer insulating layer and the step of forming an overlying wiring layer connected to the wiring layer via the via hole are repeated, and thus a desired multilayer can be obtained.

As the technology related with the above prior art, in Patent Literature 1 (Patent Application Publication (KOKAI) 2003-8199), it is set forth that uneven portions are formed on a surface of a copper layer by the etching using a sulfuric acid hydrogen peroxide mixture, and then the surface of the copper layer is roughened by applying the blackening process to the uneven portions.

Also, in Patent Literature 2 (Patent Application Publication (KOKAI) Hei-2-238942), it is set forth that, in order to improve adhesion between a copper foil and a resin, a coating film made of copper oxide is formed on a surface of the copper foil, and then the surface of the copper foil is roughened by fusing/removing the copper oxide by means of the chemical process using acid.

As described above, in the method of manufacturing the build-up wiring substrate in the prior art, the surface of the wiring layer is etched by about 1 to 2 μm in order to secure the adhesion between the wiring layer and the overlying interlayer insulating layer (resin).

Figure 1A:
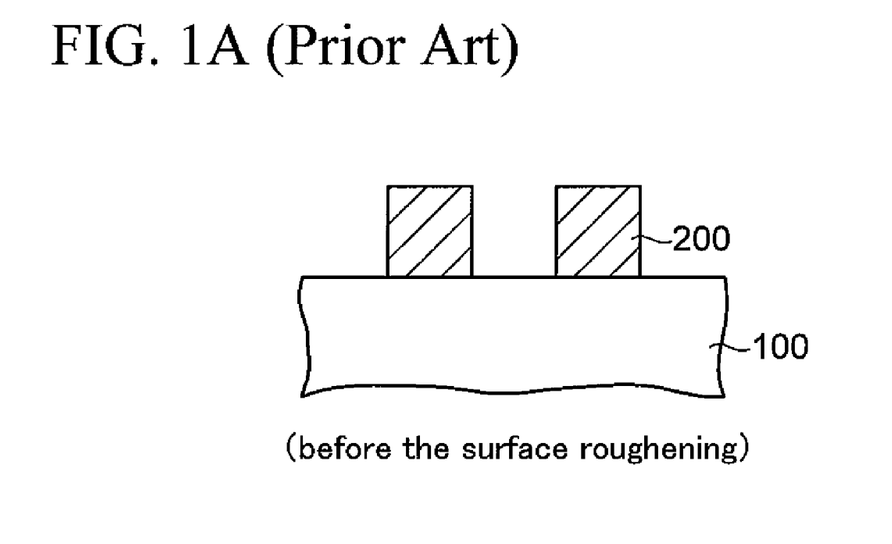
FIGS. 1A and 1B are sectional views showing the problem in a method of manufacturing a wiring substrate in the prior art.
Figure 1B:
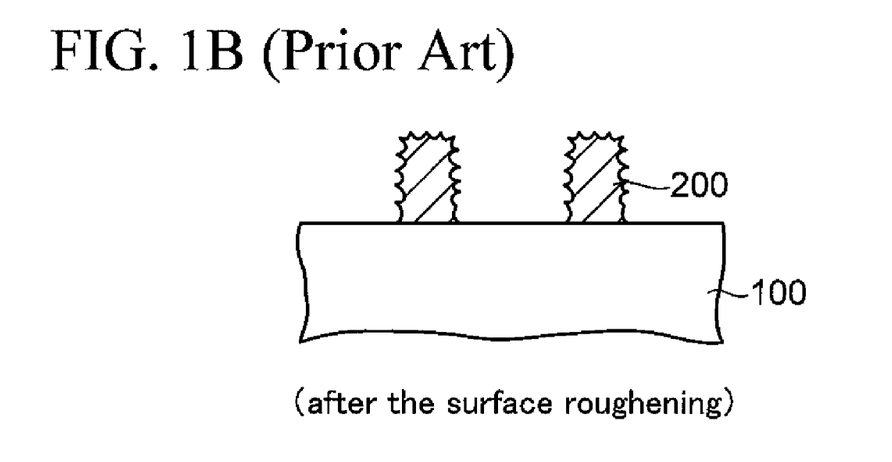

However, as shown in FIGS. 1A and 1B, when the wiring layers 200 are made minute (line:space=10:10 μm or less), a ratio of an etching amount to a line width of a wiring layer 200 (FIG. 1A) before the roughening process is increased. Therefore, the wiring layer 200 (FIG. 1B) after the roughening process is considerably narrowed and goes out of a design specification, and furthermore the pattern jump (pattern disappearance) is caused. Also, when a line width of the wiring layer 200 becomes narrower than the design specification, the problem of a delay of the electric signal arises. As a result, such wiring substrate cannot easily respond to the wiring substrate of the high-performance semiconductor chip.

Conversely, when an etching amount is reduced in order to ease the thinning of the wiring layer 200, the unevenness is made small. Therefore, satisfactory adhesion between the wiring layer 200 and the interlayer insulating layer (resin) cannot be obtained, and thus reliability of the wiring substrate is decreased.

SUMMARY OF THE INVENTION

It is an object of the present invention to provide a method of manufacturing a wiring substrate, capable of responding to miniaturization (line:space=10:10 μm or less) of a wiring layer, and also obtaining sufficient adhesion between the wiring layer and an overlying insulating layer.

The present invention is concerned with a method of manufacturing a wiring substrate, which includes the steps of forming a seed layer on an underlying layer; forming a plating resist, in which an opening portion is provided in a portion where a wiring layer is arranged, on the seed layer; forming a copper plating layer in the opening portion in the plating resist, by an electroplating utilizing the seed layer as a plating power feeding path; removing the plating resist; obtaining the wiring layer composed of the seed layer and the copper plating layer by wet-etching the seed layer using the copper plating layer as a mask; roughening a surface of the wiring layer by a blackening process; and forming an insulating layer on the wiring layer; wherein a surface of the copper plating layer is soft-etched simultaneously in the step of etching the seed layer, whereby a soft etching step of the wiring layer carried out prior to the step of the blackening process is omitted.

The inventor of this application has studied earnestly the technology to attain both the securing of a line width of the wiring layer and the good adhesion of the interlayer insulating layer, in the method of roughening the surfaces of the wiring layers by the blackening process in order to secure the adhesion of the insulating layer on the wiring layers.

In the subtractive process in which the wiring layers are obtained by patterning the copper plating layer, in order to obtain the needle-shaped copper bodies stably such that nonuniformity in the substrate is not caused in the blackening step, the surfaces of the wiring layers must be soft-etched up to a depth of about 0.5 to 2 μm prior to the blackening process. Therefore, when the wiring layers are made minute (smaller than a ratio of line:space=10:10 μm), it is difficult to obtain the wiring layers that have a line width to meet the design specification.

The inventor of this application found the fact that, even when the soft etching step carried out particularly prior to the blackening process is omitted, the failure is not caused in the blackening processes by forming the wiring layers by means of the semi-additive process.

In the semi-additive process, first, the plating resist in which the opening portions are provided is formed on the seed layer, and then the copper plating layer is formed in the opening portions of the plating resist by the electroplating. Then, the plating resist is removed, and then the wiring layers are obtained by wet-etching the seed layer using the copper plating layers as a mask.

The inventor of this application focused the matter in which the surfaces of the copper plating layers are soft-etched simultaneously when the seed layer is wet-etched, and tried to omit the soft etching step carried out particularly. As the result, the inventor found the fact that the formation of the needle-shaped copper bodies by the blackening process can be carried out satisfactorily without nonuniformity in the substrate by the above method. Accordingly, the soft etching step applied to etch a surface by about 0.5 to 2 µm can be omitted. Therefore, an etching amount of the copper plating layers prior to the blackening process can be suppressed to an etching amount (0.5 µm or less) in the etching step of the seed layer.

In this manner, in the present invention, the soft etching step carried out particularly prior to the blackening process can be omitted by forming the wiring layers by means of the semi-additive process. Therefore, the thinning of the wiring layers can be suppressed and the manufacturing method can respond to the miniaturization of the wiring layers (line: space=10:10 µm or less). In addition, since the surfaces of the wiring layers are roughened sufficiently by the blackening process, the sufficient adhesion between the wiring layers and the overlying insulating layer can be obtained.

In a preferred mode of the present invention, the seed layer is formed by the electroless plating. An etching rate of the seed layer formed by the electroless plating is considerably higher than an etching rate of the copper plating layers formed by the electroplating. By utilizing this etching property, an etching amount of the copper plating layers can be suppressed easily smaller than 0.5 µm (e.g., 0.2 to 0.3 µm).

By using the present invention, when the multiplayer wirings constituting the stacked via structure in which the via holes whose diameter is 50 to 70 µm are stacked were formed and then the heat cycle test was applied, it was checked that high reliability of the stacked vias can be achieved.

As explained above, the present invention can respond to the miniaturization of the wiring layers (line:space=10:10 µm or less), and also the satisfactory adhesion between the wiring layers and the overlying insulating layer can be obtained.

DETAILED DESCRIPTION OF THE PREFERRED EMBODIMENTS

An embodiment of the present invention will be explained with reference to the accompanying drawings hereinafter.

Prior to explanation of an embodiment of the present invention, the problems in the related art of the present invention will be explained hereunder. FIGS. 2A to 2E are sectional views showing a method of manufacturing a wiring substrate in the related art, and FIG. 3 is a step flowchart explaining steps of roughening a wiring layer in manufacture of the wiring substrate in the related art.

Figure 2A:
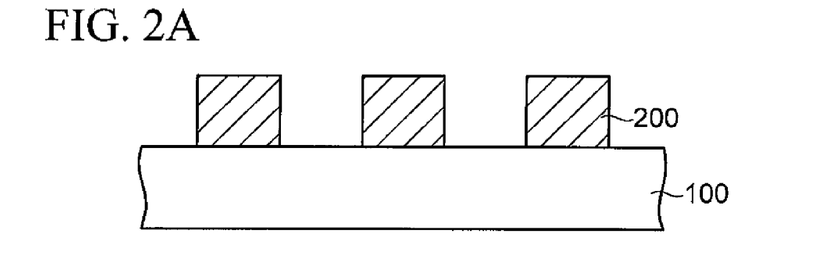
FIGS. 2A to 2E are sectional views showing a method of manufacturing a wiring substrate in the related art that is associated with the present invention.
Figure 3:
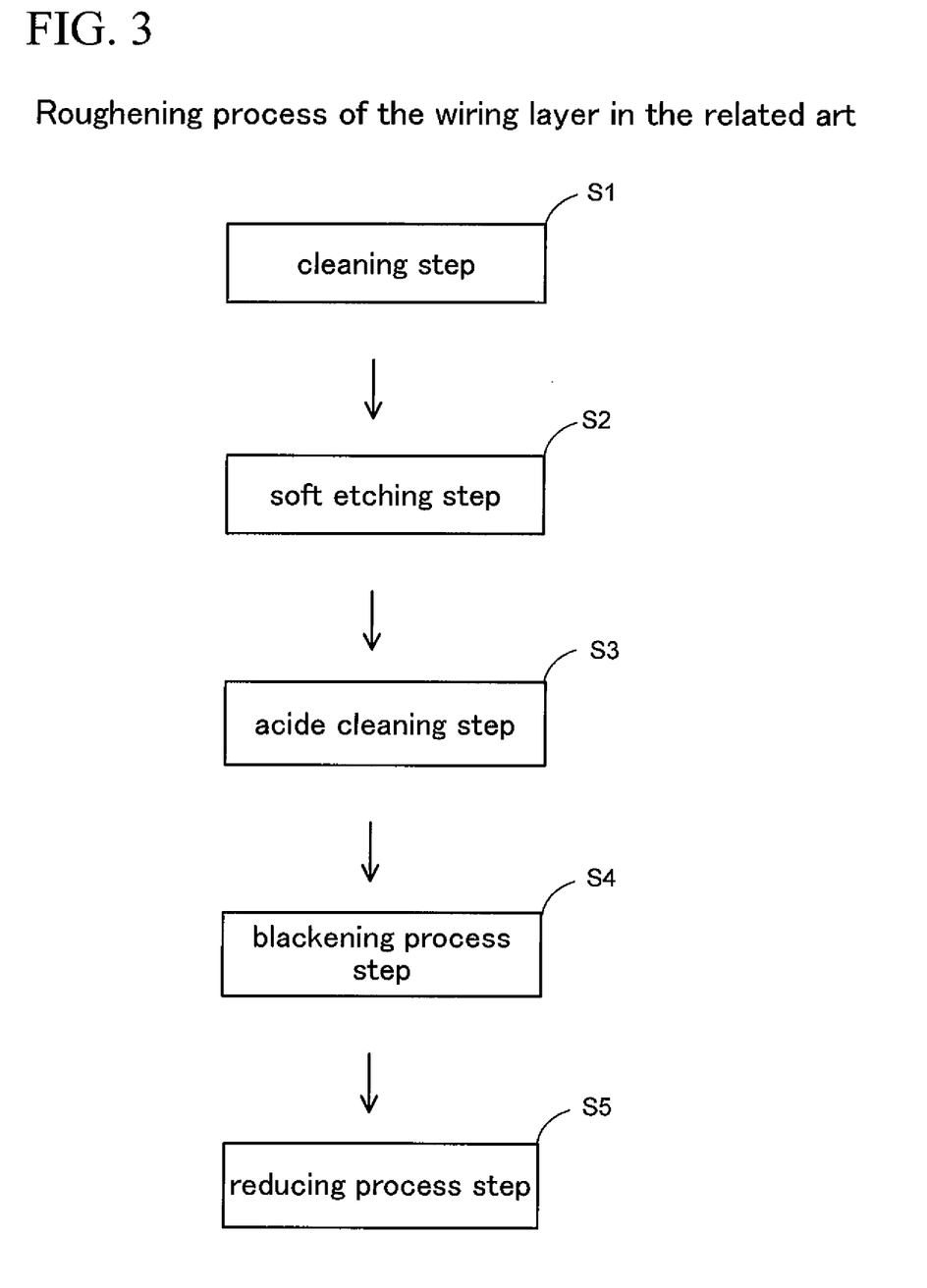
FIG. 3 is a step flowchart explaining steps of roughening a wiring layer in manufacture of the wiring substrate in the related art.

In the method of manufacturing the wiring substrate in the related art, as shown in FIG. 2A, first, the wiring layers 200 made of copper are formed on the substrate 100. The wiring layers 200 are formed by the subtractive process. In more detail, first, a copper layer (not shown) is formed on the whole surface of the substrate 100 by the plating method. Then, a resist pattern (not shown) used to form the wiring layers 200 is formed on the copper layer. Then, the copper layer is wet-etched through opening portions in the resist pattern, and then the resist is removed by an alkaline aqueous solution. Thus, the wiring layers 200 are obtained.

Figure 2B:
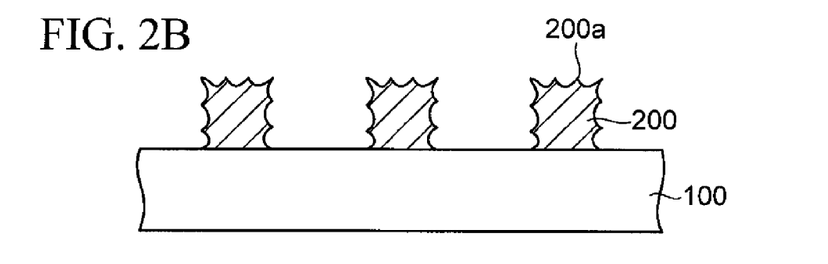

Next, steps of roughening the wiring layer 200 will be explained hereunder by referring to the step flowchart in FIG. 3 appropriately. First, surfaces of the substrate 100 and the wiring layer 200 in FIG. 2A are cleaned by the alkaline aqueous solution (step S1 in FIG. 3). Then, as shown in FIG. 2B, the surfaces of the wiring layers 200 are soft-etched by a sodium persulfate aqueous solution, a potassium aqueous solution, or a sulfuric acid hydrogen peroxide mixture (mixed aqueous solution of sulfuric acid and hydrogen peroxide solution), and thus an uneven surface (concave-convex surface) 200a is formed on the surfaces of the wiring layers 200 (step S2 in FIG. 3).

In this soft etching step, the surfaces of the wiring layers 200 are etched by about 0.5 to 2 µm and the uneven surface 200a is obtained. Then, the substrate 100 and the wiring layers 200 on which the uneven surface 200a is formed respectively are acid-cleaned by the sulfuric acid (step S3 in FIG. 3).

Figure 2C:
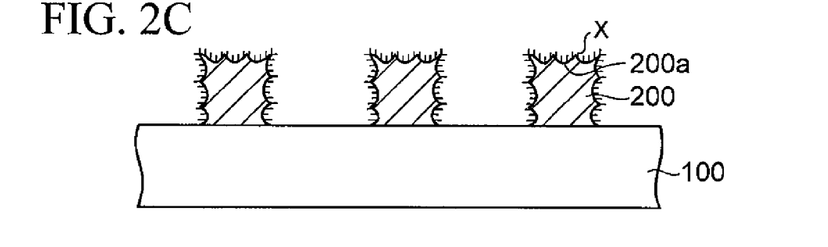

Then, as shown in FIG. 2C, a blackening process is applied to the uneven surfaces 200a of the wiring layers 200 by using a mixed aqueous solution of sodium hydroxide (NaOH) and sodium chlorite ($NaClO_2$) (step S4 in FIG. 3). At this time, needle-shaped crystalline bodies X containing a copper oxide as a principal component are formed on the uneven surfaces 200a of the wiring layers 200 respectively.

Figure 2D:
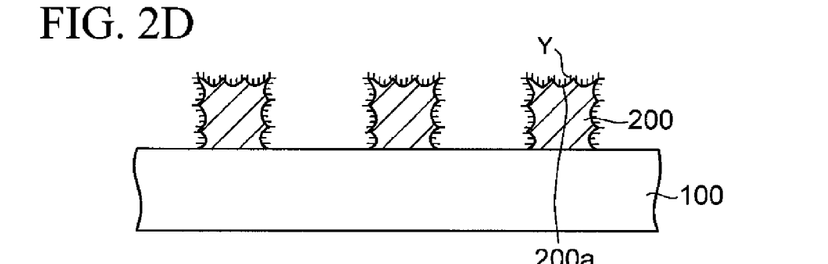

Then, as shown in FIG. 2D, the surfaces of the wiring layers 200 on which the blackening process is carried out are reduction-processed, and thus the needle-shaped crystalline bodies X is reduced, thereby such situation is obtained that needle-shaped copper bodies Y are formed on the uneven surfaces 200a of the wiring layers 200 respectively (step S5 in FIG. 3). According to the above method, the fine needle-shaped copper bodies Y are formed on the uneven surfaces 200a of the wiring layers 200 respectively and their surfaces are roughened.

Figure 2E:
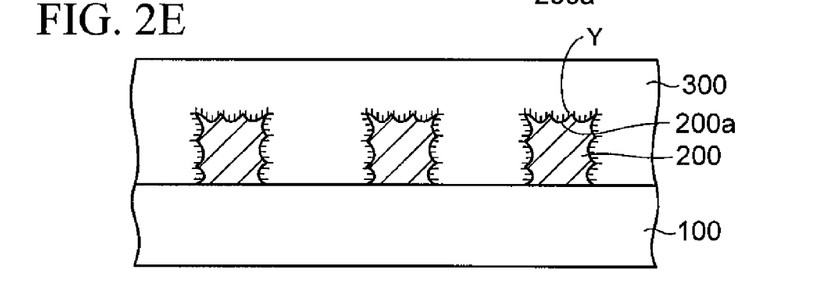

Then, as shown in FIG. 2E, an interlayer insulating layer 300 is formed by pasting a resin film on the wiring layers 200 whose surface is roughened respectively.

As described above, in the related art, the uneven surfaces 200a are formed by soft-etching (etching amount: 0.5 to 2 µm) the surfaces of the wiring layers 200, and the surfaces of the wiring layers 200 are roughened by forming the needle-shaped copper bodies Y on the uneven surfaces 200a by means of the blackening process.

Accordingly, the roughened surfaces of the wiring layers 200 act as the anchor, and thus the adhesion between the wiring layers 200 and the interlayer insulating layer 300 (resin) can be secured. However, when the line space of the wiring layers 200 is made minute to 10:10 µm or less particularly, it is impossible to neglect an etching amount (0.5 to 2 µm) caused by the soft etching. As a result, a line width given by the design specification cannot be obtained.

For example, when the soft etching is applied to the extent of about 1 µm in a situation that a line width of the wiring layer 200 is 10 μm, the line width of the wiring layer 200 is narrowed to about 8 μm. Thus, a space is extended up to about 12 μm, and the wiring layers cannot be obtained according to the design specification. It is needless to say that the thinning of the wiring layer 200 becomes more conspicuous when the wiring layers 200 are made minute as the further finer patterns.

When the soft etching step (step S2 in FIG. 3) is omitted in order to reduce the thinning of the wiring layer 200, such a problem is caused that the surfaces of the wiring layers 200 have nonuniformity in the substrate 100 in the blackening process step (after the reducing process). In other words, the surfaces of the wiring layers 200 are not etched (cleaned) by the sulfuric acid hydrogen peroxide mixture, or the like when the soft etching step is omitted, so that areas in which the needle-shaped copper bodies Y acting as the anchor are not formed well are ready to occur and thus the adhesion of the interlayer insulating layer 300 is decreased in these areas.

Also, in the related art, the method of reducing a soft etching amount of the wiring layers 200 may be considered. In this case, when a soft etching amount is reduced, the blackening process tends to become unstable on the wiring layers 200 which are formed by the subtractive process, and a process margin is narrow.

In this manner, in the related art, the securing of a line width of the wiring layer 200 and the good adhesion of the interlayer insulating layer 300 have a trade-off relationship, and it is difficult to attain them simultaneously.

According to the embodiment of the present invention explained hereunder, the above failure can be solved.

Embodiment

FIGS. 4A to 4D, FIGS. 5A to 5D, and FIGS. 6A and 6B are sectional views showing a method of manufacturing a wiring substrate according to an embodiment of the present invention.

The inventor of this application has studied earnestly the technology to attain both the securing of a line width of the wiring layer and the good adhesion of the interlayer insulating layer. As a result, the inventor of this application found the fact that, by forming the wiring layers by means of the semi-additive process, the satisfactory adhesion between the wiring layers and the interlayer insulating layer can be obtained not to cause the failures even though the soft etching step applied prior to the blackening process (step S2 in FIG. 3) is omitted.

Figure 4A:
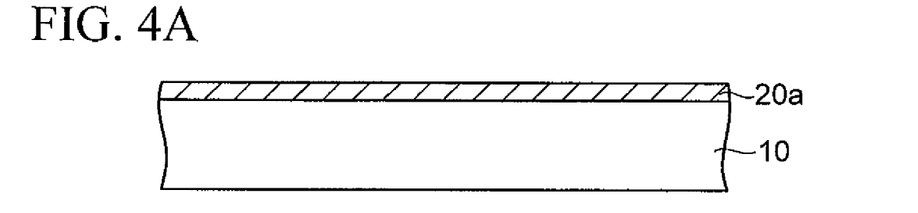
FIGS. 4A to 4D are sectional views (#1) showing a method of manufacturing a wiring substrate according to an embodiment of the present invention.

In the method of manufacturing the wiring substrate of the embodiment of the present invention, as shown in FIG. 4A, first, a seed layer 20a is formed on an insulating substrate 10 by the electroless plating. The seed layer 20a is formed of copper, and a thickness of the seed layer 20a is about 1 μm, for example. The substrate 10 is illustrated as an underlying layer on which the wiring layers are formed. But an insulating layer formed on the substrate 10, or the like may be employed. Also, as the substrate 10, the rigid type may be employed or the flexible type may be employed.

Figure 4B:
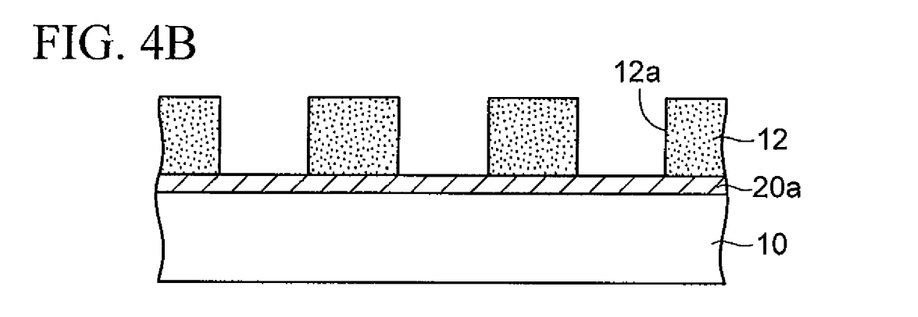

Then, as shown in FIG. 4B, a plating resist 12 in which opening portions 12a are provided in portions where the wiring layers are arranged is formed on the seed layer 20a. The plating resist 12 is formed by pasting a dry film resist or coating a liquid resist and then patterning the resist by the photolithography (exposure/development).

Figure 4C:
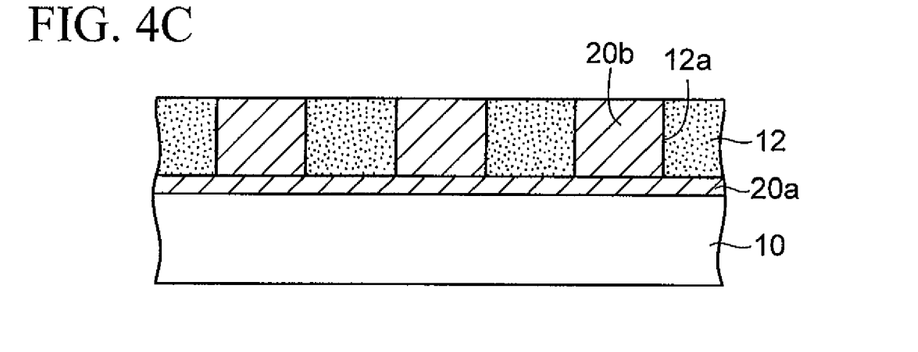
Figure 4D:
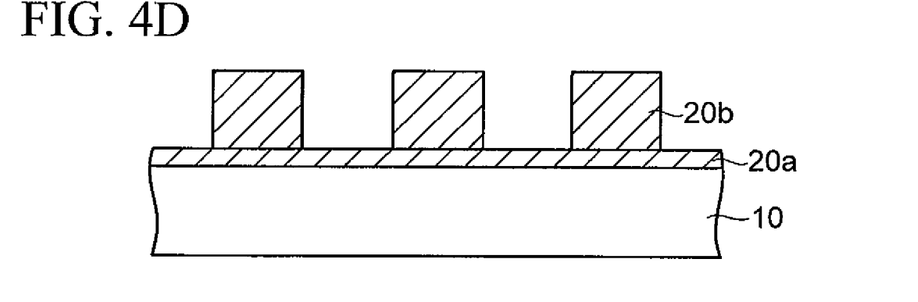

Then, as shown in FIG. 4C, a copper plating layer 20b is formed in the opening portions 12a of the plating resist 12 respectively by the electroplating using the seed layer 20a as a plating power feeding path. Then, as shown in FIG. 4D, the seed layer 20a is exposed by removing the plating resist 12.

Figure 5A:
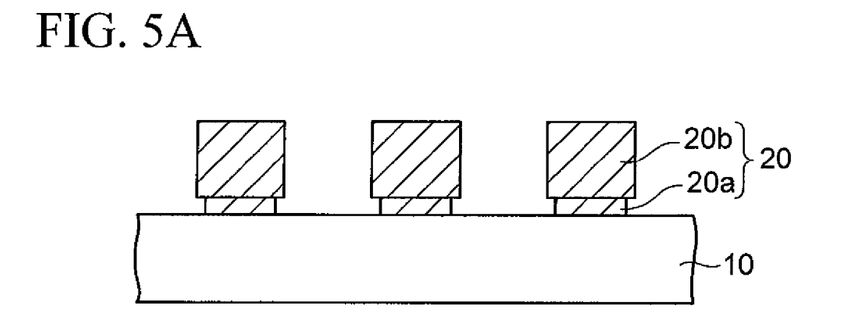
FIGS. 5A to 5D are sectional views (#2) showing the method of manufacturing the wiring substrate according to the embodiment of the present invention.

Then, the seed layer 20a is wet-etched by using the copper plating layers 20b as a mask. As an etchant of the wet etching, an acidic aqueous solution such as the sulfuric acid hydrogen peroxide mixture (mixed aqueous solution of sulfuric acid and hydrogen peroxide solution), or the like. Accordingly, as shown in FIG. 5A, wiring layers 20 each composed of the seed layer 20a and the copper plating layer 20b are obtained.

In particular, when the seed layer 20a (copper) is formed by the electroless plating, an etching rate of the seed layer 20a (copper) in the sulfuric acid hydrogen peroxide mixture is considerably higher than an etching rate of the copper plating layers 20b which is formed by the electroplating. Hence, when a thickness of the seed layer 20a is 1 μm, an etching amount of the copper plating layers 20b upon etching the seed layer 20a can be suppressed smaller than 0.5 μm.

From the above viewpoint, it is preferable that the seed layer 20a should be formed by the electroless plating. In this case, when the thin seed layer 20a is formed by the sputter method, or the like, the thinning of the copper plating layers 20b upon etching the seed layer 20a can be suppressed similarly.

The inventor of this application found the fact that, in the step of etching the seed layer 20a by the semi-additive process, the surfaces of the copper plating layers 20b constituting substantially the wiring layers 20 are also soft-etched (cleaned) simultaneously by the acidic aqueous solution (the sulfuric acid hydrogen peroxide mixture, or the like) and thus the surfaces of the copper plating layers 20b become the surfaces which are suited to the blackening process.

This is because the inventor focused the matter such that, since an etching rate of the seed layer 20a is considerably higher than an etching rate of the copper plating layers 20b, as described above, the surfaces of the copper plating layers 20b are soft-etched adequately in the step of etching the thin seed layer 20a.

Although not particularly illustrated in FIG. 5A, the surfaces of the wiring layers 20 are etched in the etching step of the seed layer 20a such that a one surface layer thereof is peeled off, and thus the uneven surface (concave-convex surface) whose height difference is smaller than that in the related art is provided. A soft etching amount of the copper plating layers 20b can be controlled smaller than 0.5 μm by controlling the forming method and a film thickness of the seed layer 20a.

In the present embodiment, the etching step of the seed layer 20a is also applied as the soft etching step (pretreatment of the blackening process) of the wiring layers 20. Therefore, even when the particular soft etching step (step S2 in FIG. 3) carried out in the related art is omitted, the formation of the needle-shaped copper bodies by the blackening process, described later, can be done satisfactorily without the nonuniformity in the substrate 10.

According to the subtractive process employed in the related art, the resist is formed on the wiring layers, and thus the upper surfaces of the wiring layers are hardly etched in the resist removing step. Therefore, the soft etching step is necessary for carrying out stably the blackening process.

In this manner, in the present embodiment, the soft etching step (step S2 in FIG. 3) applied to etch the surface by about 0.5 to 2 μm in the related art can be omitted. Accordingly, an etching amount of the surfaces of the copper plating layers 20b (the wiring layers 20) prior to the blackening process can be suppressed to the same extent as an etching amount (0.5 μm or less) in the etching step of the seed layer 20a. As a result, the thinning of the wiring layers 20 can be suppressed and the manufacturing method can respond to the miniaturization of the wiring layers.

Next, the method of roughening the surfaces of the wiring layers 20 by the blackening process will be explained hereunder.

In FIG. 5A, first, the wiring layers 20 are cleaned by the alkaline aqueous solution (step S1 in FIG. 3). In the present embodiment, the soft etching step (step S2 in FIG. 3) in the related art is omitted. This is because, as described above, the surfaces of the copper plating layers 20b are soft-etched previously by the sulfuric acid hydrogen peroxide mixture, or the like in the etching step of the seed layer 20a. Then, the wiring layers 20 are acid-cleaned by the sulfuric acid (step S3 in FIG. 3).

Figure 5B:
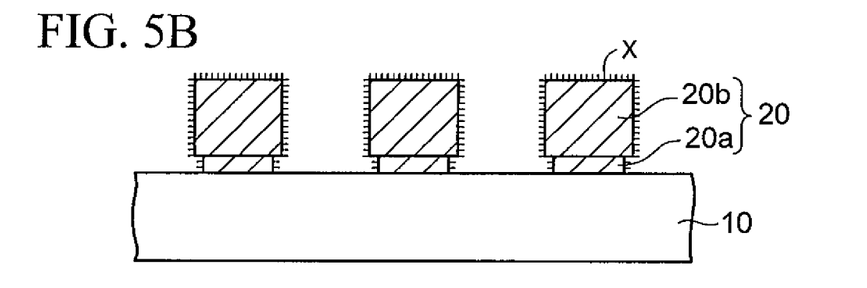
Figure 5C:
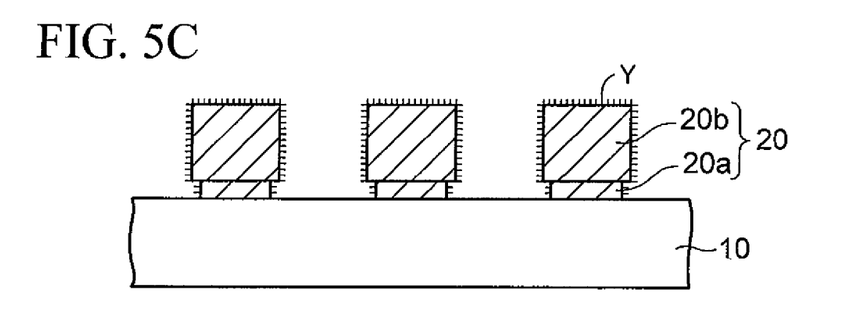

Then, as shown in FIG. 5B, the surfaces of the wiring layers 20 are blackening-processed by using a mixed aqueous solution of sodium hydroxide (NaOH) and sodium chlorite (NaCl$_2$) (step S4 in FIG. 3) At this time, the needle-shaped crystalline bodies X containing a copper oxide as a principal component are formed on the surfaces of the wiring layers 20 respectively. Then, as shown in FIG. 5C, the surfaces of the wiring layers 20 which are blackening-processed are reduction-processed by using a reducing process solution (step S5 in FIG. 3).

As the reducing process solution, dimethylamineborane solution, DMAB system (dimethylamineborane), SBH system (boron sodium hydroxide), EDTA system (ethylene-diaminetetraacetic acid), HCHO system (formalin), and the like are employed. Accordingly, the needle-shaped crystalline bodies X (copper oxide) are reduced, and thus the needle-shaped copper bodies Y are formed on the surfaces of the wiring layers 20. Therefore, the surfaces of the wiring layers 20 are sufficiently roughened.

The needle-shaped crystalline bodies X containing the copper oxide as a principal component are formed of CuO and Cu$_2$O mixedly. Then, CuO whose adhesive strength is small is removed in the reducing process step, and remaining Cu$_2$O whose adhesive strength is large is reduced, and it becomes the needle-shaped copper bodies Y.

By blackening-processing the surfaces of the wiring layers 20 with such method, the blackening process can be done without the nonuniformity in the substrate 10 upon forming the needle-shaped copper bodies Y, even though the soft etching step of the wiring layers 20 (step S2 in FIG. 3) is omitted. Therefore, the surfaces of the wiring layers 20 can be roughened stably.

Also, the soft etching step by which the surface is etched by the amount of 0.5 to 2 µm can be omitted. Therefore, the thinning of the wiring layers 20 can be suppressed to the same extent as an etching amount (0.5 µm or less on one side (e.g., about 0.2 to 0.3 µm)) caused when the seed layer 20a is etched by the semi-additive process. As a result, when a design rule whose line:space of the wiring layers 20 is 10:10 µm is employed, the line width of the wiring layers can be set to 9 µm or more and the space can be set to 11 µm or less, and thus the wiring layers can be formed within the design specification.

Figure 5D:
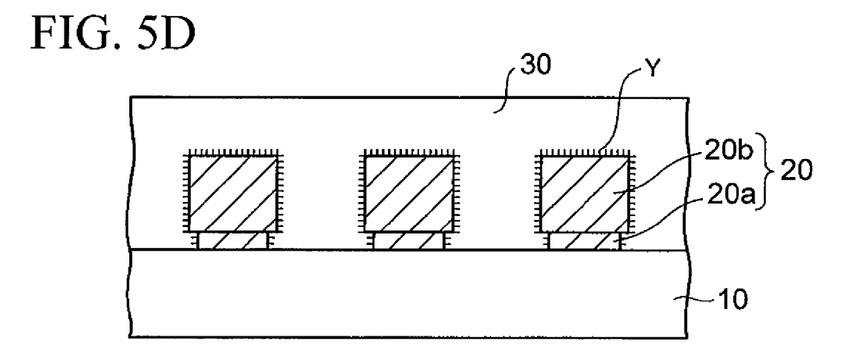

Then, as shown in FIG. 5D, an interlayer insulating layer 30 is formed by pasting a resin film on the wiring layers 20 which are blackening-processed, or the like. As the preferable material of the interlayer insulating layer 30, an epoxy resin, or the like is employed. At this time, the roughened surfaces of the wiring layers 20 serve as the anchor, and the satisfactory adhesion between the wiring layers 20 and the interlayer insulating layer 30 (resin) can be secured.

Figure 6A:
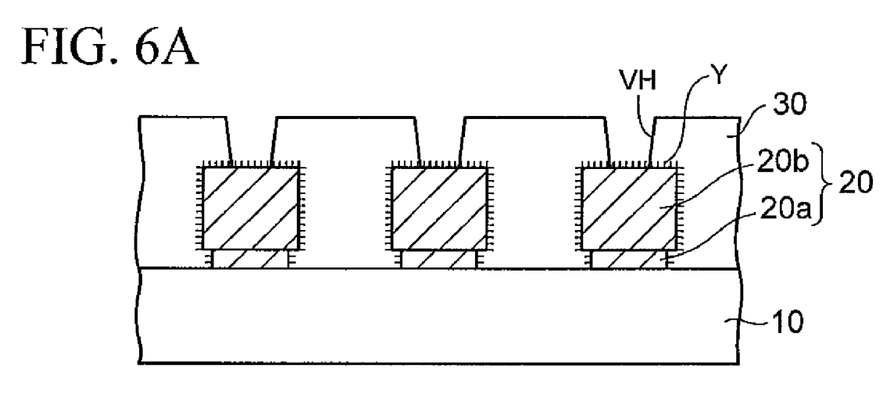
FIGS. 6A and 6B are sectional views (#3) showing the method of manufacturing the wiring substrate according to the embodiment of the present invention.
Figure 6B:
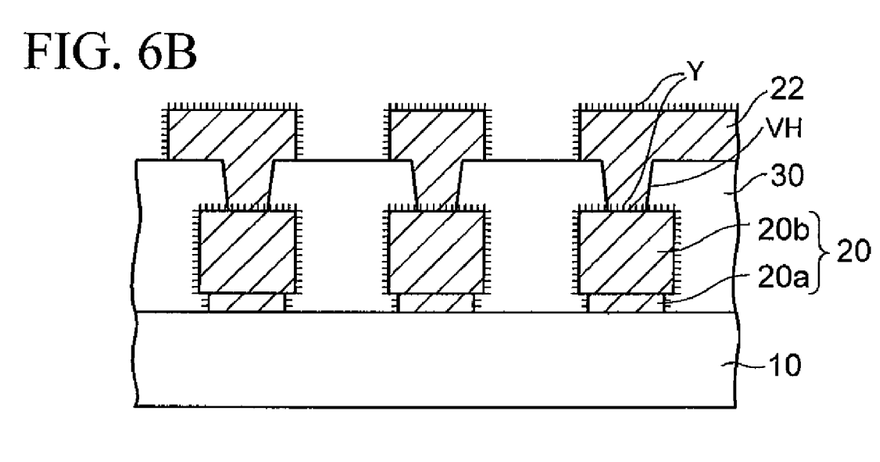

Then, as shown in FIG. 6A, via holes VH each having a depth that reaches the wiring layer 20 are formed by processing the interlayer insulating layer 30 using the laser, or the like. Then, as shown in FIG. 6B, an overlying wiring layers 22 connected to the wiring layers 20 via the via holes VH are formed by the semi-additive process. Then, surfaces of the overlying wiring layers 22 are blackened/reduced by the similar methods to the above-mentioned method, and thus the needle-shaped copper bodies Y are formed and the surfaces are roughened.

In this case, the step of forming the wiring layers 20, the step of forming the interlayer insulating layer 30, the step of forming the via holes VH, and the step of forming the overlying wiring layers 22 may be repeated. Thus, an n-layered (n is an integer of 2 or more) multilayer wiring layers can be formed arbitrarily.

As an example constituting the wiring substrate, although not particularly shown, through electrodes (through hole plating layers, or the like) are provided in the substrate 10, and the wiring layers connected mutually via the through electrodes are stacked on both surface sides of the substrate 10 respectively. Then, a semiconductor chip is mounted on one surface side of the substrate 10, and external connection terminals are provided on the other surface side.

Next, the adhesion between the wiring layers 20 and the interlayer insulating layer 30 will be explained hereunder.

The inventor of this application formed the test sample in which the copper layer is formed on the substrate by the semi-additive process and then the surface of the copper layer is subjected to the blackening process by the above-mentioned manufacturing method of the present embodiment, and then measured a surface roughness (Ra) of the copper layer before and after the blackening process. As the conditions of the blackening process, the mixed aqueous solution of sodium hydroxide (NaOH) and sodium chlorite (NaClO$_2$) is used, a processing temperature is set to 70° C., and a processing time is set to 5 minutes.

According to the result, a surface roughness (Ra) of the copper layer before the blackening process (after the copper layer was formed by the semi-additive process) was about 140 nm (typical value), and a surface roughness (Ra) of the copper layer after the blackening process (after the reducing process) was about 170 nm (typical value) Thus, a surface roughness (Ra) of the copper layer is increased by about 30 nm in the blackening process. That is, the sufficient adhesive strength can be obtained based on a difference of about 30 nm in a surface roughness (Ra). In the present embodiment, a surface roughness (Ra) of the copper layer can be controlled within 100 to 200 nm under various conditions.

Also, the inventor of this application formed the interlayer insulating layer made of an epoxy resin on the copper layer of the above test sample, and measured a peel strength of the interlayer insulating layer. Also, as a comparative example, the inventor of this application formed the comparative sample in which unevenness is formed by etching the surface of the copper layer on the substrate by 0.5 to 2 µm and the interlayer insulating layer made of an epoxy resin is formed thereon, and then compared a peel strength of the interlayer insulating layer between the test sample and comparative sample.

According to the result, a peel strength of the interlayer insulating layer of the comparative sample was 107.9 kPa, and a peel strength was lowered to 53.7 kPa after a stress was applied in the conditions of 130° C., 85 wt %, and 100 hours. In contrast, a peel strength of the interlayer insulating layer of the test sample of the present embodiment was 133.7 kPa, and a peel strength was 131.8 kPa after a stress was applied in the same conditions. Therefore, a remarkable reduction in the peel strength caused by the stress application did not appear in the test sample.

In this manner, in the wiring layers 20 formed by the method of manufacturing the wiring substrate of the present embodiment, their surfaces can be roughened sufficiently by the blackening process and thus sufficient adhesion of the interlayer insulating layer 30 can be secured. Also, the thinning of the line width of the wiring layers 20 can be suppressed smaller than that in the related art. Therefore, the wiring layers whose line:space is set to 10:10 μm or less can be formed in compliance with the design specification, and it responds to the mounting of the high-performance semiconductor chip.

Figure 7:
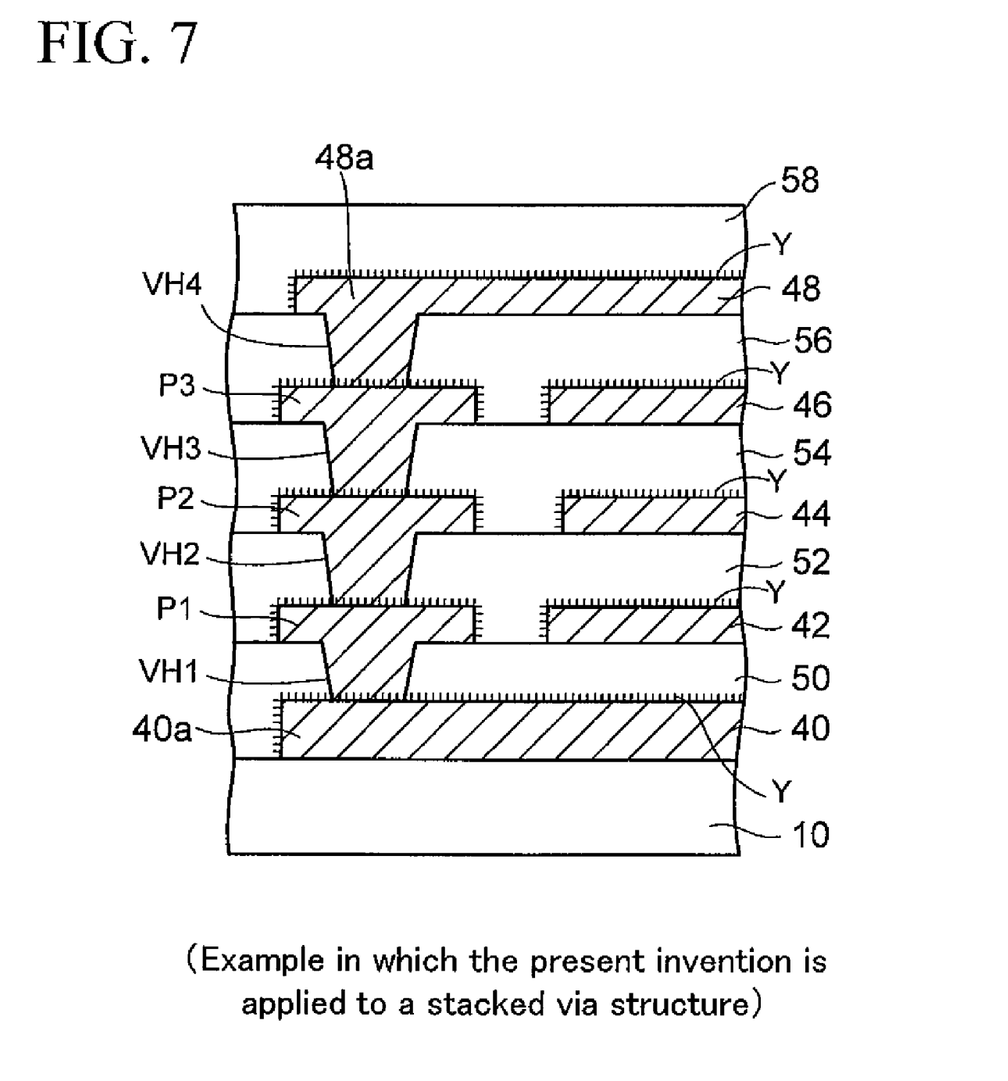
FIG. 7 is a sectional view showing the wiring substrate having a stacked via structure, manufactured by the method of manufacturing the wiring substrate according to the embodiment of the present invention.

Next, a method of manufacturing a multilayer wiring substrate having a stacked via structure by using the method of manufacturing the wiring substrate according to the present embodiment will be explained hereunder. As shown in FIG. 7, a first wiring layer 40 having a connection pad 40a is formed on the substrate 10 by the manufacturing method of the present embodiment. That is, the first wiring layer 40 is formed by the semi-additive process, and then the needle-shaped copper bodies Y are formed on the surface of the first wiring layer 40 by the blackening/reducing processes without the soft etching to roughen the surface.

Then, a first interlayer insulating layer 50 made of an epoxy resin, or the like is formed on the first wiring layer 40. Then, a first via hole VH1 reaching the connection pad 40a of the first wiring layer 40 is formed by processing the first interlayer insulating layer 50 by using the laser, or the like.

Then, a second wiring layer 42 is formed on the first interlayer insulating layer 50 by the similar method. simultaneously, a first via pad P1 connected to the connection pad 40a of the first wiring layer 4 via the first via hole VH1 is formed from in the first via hole VH1 to on the first interlayer insulating layer 50 around the via hole VH1. The first via pad P1 is embedded in the first via hole VH1 and its upper surface is formed flat. Respective surfaces of the first via pad P1 and the second wiring layer 42 are roughened similarly.

Then, a second interlayer insulating layer 52 in which a second via hole VH2 is provided on the first via pad P1 is formed by the similar method. Then, a second via pad P2 connected to the first via pad P1 via the second via hole VH2 is formed on the second interlayer insulating layer 52, and a third wiring layer 44 separated from the second via pad P2 is formed. Respective surfaces of the second via pad P2 and the third wiring layer 44 are roughened similarly.

Then, a third interlayer insulating layer 54 in which a third via hole VH3 is provided on the second via pad P2 is formed by the similar method. Then, a third via pad P3 connected to the second via pad P2 via the third via hole VH3 is formed on the third interlayer insulating layer 54, and a fourth wiring layer 46 separated from the third via pad P3 is formed. Respective surfaces of the third via pad P3 and the fourth wiring layer 46 are roughened similarly.

Then, a fourth interlayer insulating layer 56 in which a fourth via hole VH4 is provided on the third via pad P3 is formed by the similar method. Then, a fifth wiring layer 48 having a connection pad 48a connected to the third via pad P3 via the fourth via hole VH4 is formed on the fourth interlayer insulating layer 56. The surface of the fifth wiring layer 48 is also roughened similarly. Then, a fifth interlayer insulating layer 58 is formed on the fifth wiring layer 48.

Accordingly, first wiring layer 40 as the first layer is connected electrically to the fifth wiring layer 48 as the fifth-layer via the first to third via pads P1, P2, P3 stacked in the vertical direction (stacked vias). In the example in FIG. 7, the stacked via structure is formed by stacking five wiring layers (40, 42, 44, 46, 48). But any stacked via structure can be formed by stacking the n-layered (n is an integer of 3 or more) wiring layers, or more.

The inventor of this application manufactured actually the multilayer wiring substrate having the stacked via structure shown in FIG. 7 by the above-mentioned manufacturing method of the present embodiment, and examined reliability of the electrical connection of the stacked vias. As a comparative example, the inventor of this application manufactured the multilayer wiring substrate having the stacked via structure as the same structure by using such a technique that the surface of the wiring layer is etched by 0.5 to 2 μm to form the unevenness, and then similarly examined reliability of the electrical connection of the stacked vias for the purpose of comparison.

In both multilayer wiring substrates in the present embodiment and the comparative example, respective via diameters of the first to fourth via holes VH1 to VH4 to be stacked were set to 67 μm. Then, the heat cycle test was applied to respective multilayer wiring substrates in a temperature range of −60 to 150° C.

According to the result, in the multilayer wiring substrate in the comparative example, the open failure occurred in the stacked vias of 33.3% at a point of time when the 1200 heat cycles were applied.

In contrast, in the multilayer wiring substrate in the present embodiment, no open failure occurred in the stacked vias after the 2000 heat cycles were applied, and the via conduction in compliance with the design specification could be obtained.

As described above, when the method of manufacturing the wiring substrate of the present embodiment is employed, the wiring substrate having the stacked via structure in which via holes whose diameter is 50 to 70 μm (also 30 to 50 μm) are stacked can be manufactured with good reliability.

What is claimed is:

1. A method of manufacturing a wiring substrate, comprising the steps of:
    forming a seed layer made of copper on an underlying layer;
    forming a plating resist, in which an opening portion is provided in a portion where a wiring layer is arranged, on the seed layer;
    forming a copper plating layer in the opening portion in the plating resist, by an electroplating utilizing the seed layer as a plating power feeding path;
    removing the plating resist;
    obtaining the wiring layer composed of the seed layer and the copper plating layer by wet-etching the seed layer using the copper plating layer as a mask;
    then, without an intervening etching of the wiring layer, roughening a surface of the wiring layer by a blackening process that needle-shaped crystalline bodies containing a copper oxide as a principal component are formed on a surface of the wiring layer, wherein treatment liquid used in the blackening process includes sodium hydroxide (NaOH) and sodium chlorite ($NaClO_2$); and
    forming an insulating layer on the wiring layer;
    wherein a surface of the copper plating layer is etched simultaneously in the step of etching the seed layer, and an etching amount of the copper plating layer in the etching step of the seed layer prior to the blackening process is suppressed to 0.5 μm or less, thus the surface of the copper plating layer and a side surface of the seed layer are made to an uneven surface by the etching.

2. A method of manufacturing a wiring substrate according to claim 1, wherein, in the step of forming the seed layer, the seed layer is formed by an electroless plating.

3. A method of manufacturing a wiring substrate according to claim 1, wherein a value of line : space is set to 10:10 μm or less in a design rule of the wiring layer.

4. A method of manufacturing a wiring substrate according to claim 1, wherein, in the step of roughening the surface of the wiring layer by the blackening process, a surface roughness (Ra) of the wiring layer is 100 to 200 nm.

5. A method of manufacturing a wiring substrate according to claim 1, wherein the insulating layer is made of an epoxy resin.

6. A method of manufacturing a wiring substrate according to claim 1, wherein, in the step of wet etching the seed layer, an acidic aqueous solution is used as etchant.

7. A method of manufacturing a wiring substrate according to claim 6, wherein the acidic aqueous solution is a mixed aqueous solution of sulfuric acid and hydrogen peroxide solution.

8. A method of manufacturing a wiring substrate according to claim 1, after the step of forming the insulating layer, further comprising steps of:
    forming a via hole, which reaches the wiring layer, by processing the insulating layer; and
    forming an overlying wiring layer which is connected to the wiring layer via the via hole, on the insulating layer, by carrying out from the step of forming the seed layer to the step of blackening-processing the wiring layer.

9. A method of manufacturing a wiring substrate according to claim 8, wherein an n-layered (n is an integer of 3 or more) multilayer wiring layer having a stacked via structure in which the via holes are stacked in a vertical direction is formed, based on the manufacturing method set forth in claim 8.

10. A method of manufacturing a wiring substrate according to claim 9, wherein respective diameters of the via holes constituting the stacked via structure are 50 to 70 μm.

* * * * *